(12) United States Patent
Gudgel et al.

(10) Patent No.: US 10,566,784 B2
(45) Date of Patent: Feb. 18, 2020

(54) SYSTEM AND METHOD FOR MODULAR ELECTRIC DEVICE HAVING BIASED MODULAR SAFETY DOORS

(71) Applicant: MidNite Solar, Inc., Arlington, WA (US)

(72) Inventors: Robin Wayne Gudgel, Arlington, WA (US); Robert Anthony Quarterman, Granite Falls, WA (US)

(73) Assignee: Midnite Solar, Inc., Arlington, WA (US)

( * ) Notice: Subject to any disclaimer, the term of this patent is extended or adjusted under 35 U.S.C. 154(b) by 298 days.

(21) Appl. No.: 15/264,390

(22) Filed: Sep. 13, 2016

(65) Prior Publication Data

US 2018/0077812 A1    Mar. 15, 2018

(51) Int. Cl.
| | |
|---|---|
| *H02H 7/122* | (2006.01) |
| *H02H 9/00* | (2006.01) |
| *H02J 4/00* | (2006.01) |
| *H02J 7/00* | (2006.01) |
| *H05K 5/02* | (2006.01) |
| *H05K 7/14* | (2006.01) |
| *H02J 7/35* | (2006.01) |
| *H02J 3/38* | (2006.01) |

(52) U.S. Cl.
CPC .............. *H02H 7/122* (2013.01); *H02J 3/383* (2013.01); *H02J 7/0026* (2013.01); *H02J 7/35* (2013.01); *H05K 7/1432* (2013.01)

(58) Field of Classification Search
USPC .......................................................... 307/23
See application file for complete search history.

(56) References Cited

U.S. PATENT DOCUMENTS

| | | | |
|---|---|---|---|
| 6,153,947 A | 11/2000 | Rockow et al. | |
| 6,840,783 B2 | 1/2005 | Wolford et al. | |
| 2005/0254210 A1* | 11/2005 | Grady | H05K 7/20581 361/695 |
| 2009/0256422 A1 | 10/2009 | Fox et al. | |
| 2011/0149508 A1* | 6/2011 | Malekmadani | H05K 7/1489 361/679.48 |

(Continued)

*Primary Examiner* — Hal Kaplan
*Assistant Examiner* — Xuan Ly
(74) *Attorney, Agent, or Firm* — FisherBroyles LLP; Kevin D. Jablonski

(57) ABSTRACT

Systems, apparatuses, and methods for a module door having a biased latching mechanism providing safety measures to prevent accidental shock or short circuit. In an embodiment, a modular inverter system may include an empty module receptacle that includes a cavity configured to receive any modular power device. The cavity may be covered by a module door that features a rigid door member. The rigid door member may have a hinge set on one edge that is further attached to the enclosure for the module. The hinge allows for the module door to rotate open and closed. The module door further includes a latching mechanism that holds the module door in a closed position when latched. The module door also includes a disengagement orifice that is configured to receive a disengagement protrusion positioned in the back side of a power module about to inserted into the empty module receptacle. The disengagement protrusion may penetrate the disengagement orifice thereby unlatching the module door and allowing the module door to swing open.

19 Claims, 4 Drawing Sheets

(56) References Cited

U.S. PATENT DOCUMENTS

| | | |
|---|---|---|
| 2011/0159727 A1 | 6/2011 | Howard et al. |
| 2012/0126623 A1 | 5/2012 | Koehl |
| 2012/0201016 A1* | 8/2012 | Robertson ................. F21L 4/08 |
| | | 362/183 |
| 2014/0265585 A1* | 9/2014 | Della Sera ................ H02J 3/38 |
| | | 307/52 |
| 2016/0043555 A1 | 2/2016 | Howell |
| 2016/0173672 A1* | 6/2016 | Boyce ..................... H04M 1/18 |
| | | 379/437 |
| 2017/0061095 A1* | 3/2017 | Waskin ............... G06F 19/3462 |
| 2018/0076625 A1 | 3/2018 | Gudgel et al. |

* cited by examiner

SYSTEM AND METHOD FOR MODULAR ELECTRIC DEVICE HAVING BIASED MODULAR SAFETY DOORS

BACKGROUND

Modern society requires a large amount of electrical power generated from a variety of sources. Such power may often be generated on macro levels at facilities such as hydroelectric dams, coal and natural gas-driven generators, and nuclear power plants. As technology improves in other areas, solar-powered generators and wind-powered generators are also becoming a more prevalent source of power generation in society. Generating electrical power has conventionally been accomplished by large enterprises on massive scales, such as utility companies and power companies that produce energy on the order of megawatts and tie directly to a national electrical grid. However, some newer technologies, such as solar and wind, may be well suited to produce energy on micro levels such that individual home owners may own solar- and wind-driven power generators that may supply power to a local house or even produce small amounts of energy to be fed back to the electrical grid.

As a result, a local power sink (e.g., a home), may sometimes draw power from the national electrical grid or from a local micro-generator (or both). Thus, the connection point for the local micro-generator may use a switch controller to facilitate the connections to and from the home and to and from the electrical grid. This may typically involve an inverter/charger because the local micro-generator may produce electrical energy at a voltage that is incongruent with a typical AC voltage of 120/240 volts and 60 Hz. Therefore, local switching circuitry that includes control logic, a proper number and size of inverters/chargers, and a battery for storing electrical energy are all components of a local system needed to properly generate, use and store electrical energy from a local micro-generator.

BRIEF DESCRIPTION OF THE DRAWINGS

Embodiments of the subject matter disclosed herein in accordance with the present disclosure will be described with reference to the drawings, in which.

Note that the same numbers are used throughout the disclosure and figures to reference like components and features.

DETAILED DESCRIPTION

Figure 1:
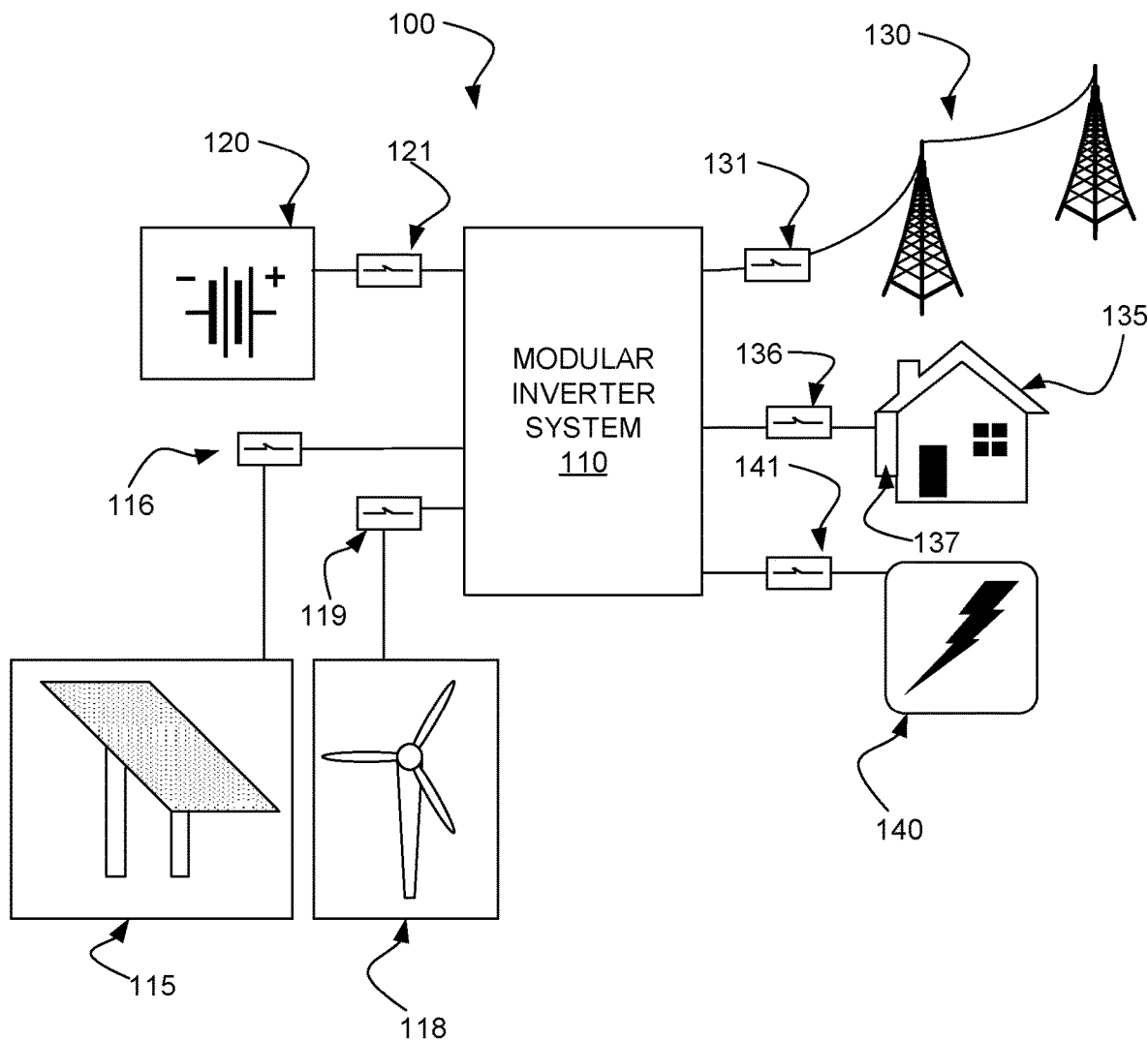
FIG. 1 is a block diagram of an electrical system at a micro level that includes a modular inverter system according to an embodiment of the subject matter disclosed herein.

The subject matter of embodiments disclosed herein is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments will be described more fully hereinafter with reference to the accompanying drawings, which form a part hereof, and which show, by way of illustration, exemplary embodiments by which the systems and methods described herein may be practiced. This systems and methods may, however, be embodied in many different forms and should not be construed as limited to the embodiments set forth herein; rather, these embodiments are provided so that this disclosure will satisfy the statutory requirements and convey the scope of the subject matter to those skilled in the art.

By way of overview, the systems and methods discussed herein may be directed to a modular inverter system having a single device enclosure with a plurality of module receptacles capable of receiving one or more modules having tailored functionality. Such modules work in conjunction with each other to handle control of various power sources and power sinks in a mixed use power generation and consumption system. In various embodiments, these swappable modules include a charge controller module configured to control charging a battery, an inverter/charger module configured to convert an AC voltage to a DC voltage for charging the battery and configured to invert a DC voltage to an AC voltage for supplying AC power, a system controller module configured to control the plurality of inverter/charger modules and the charge controller module and a backplane disposed in the enclosure such that each module receptacle facilitates engaging a respective module with the backplane.

With such a modular inverter system, a novel orientation of a module door having a biased latching mechanism provides safety measures to prevent accidental shock or short circuit. In an embodiment, the modular inverter system may include an empty module receptacle that includes a cavity configured to receive any modular power device. The cavity may be covered by a module door that features a rigid door member. The rigid door member may have a hinge set on one edge that is further attached to the enclosure for the module. The hinge allows for the module door to rotate open and closed. The module door further includes a latching mechanism that holds the module door in a closed position when latched. The latch is biased to the latched position and the hinge is biased to the closed position such that the natural state of the module door is closed and latched. The module door also includes a disengagement orifice that is configured to receive a disengagement protrusion positioned in the back side of a power module about to be inserted into the empty module receptacle. The disengagement protrusion may penetrate the disengagement orifice thereby unlatching the module door and allowing the module door to swing open.

The modular inverter system, as described, provides a number of advantages over conventional non-modular solutions. First, as a local power requirement grows, one can easily add additional functionality to the modular inverter system by simply inserting an additional module. For example, as the AC draw from a battery may grow because a home has added new circuits, one may add an additional inverter/charger module to supply inverted AC power from a local battery stack. Having empty module receptacles that are protected by safety doors biased to a closed and latched position helps facilitate a modular solution. Second, a modular inverter system allows for swapping and maintenance while the system remains under load. That is, the modules in the modular inverter system are hot-swappable and the safety door covering empty receptacles protects against accidental shock or short circuit. Third, the modular inverter system provides a simple and manageable solution for an inverter-grid tie-in such that local power generation system (e.g., wind, solar, and the like) may be continuously in use even if a battery stack is fully charged. That is, the local power that is generated may be sold back to the power company. These and other advantages will become more apparent with the discussion below in conjunction with FIGS. 1-7.

FIG. 1 is a block diagram of an electrical system 100 at a micro level that includes a modular inverter system 110 according to an embodiment of the subject matter disclosed herein. The electrical system 100 may typically be a power sink (e.g., a home, a building, and the like) with various capabilities for receiving electrical power from an electrical grid 130 or for generating local electrical power from one or more power generation sources. In this example, the power sink is a residential home 135 having a local electrical distribution panel 137 that may include a typical array of electrical devices that consumer power, such as electric heaters, lights, kitchen appliances and the like. Of course, the power sink may be any other facility, building, complex, or standalone device that uses electrical power for operation. As is common, one source for electrical power for the home 135 is the national electrical grid 130 or simply grid 130, hereinafter. In the United States, the national electrical grid comprises a power source with a nearly constant voltage of 120/240 VAC with a nearly constant frequency of 60 Hz. Industrial and commercial scenarios may further involve 3-phase connections at 208 VAC. In other countries, the grid may vary to include voltages up to 240 V and frequencies down to 50 Hz. For this example, the grid will comprise a nearly constant voltage of 120/240 VAC with a nearly constant frequency of 60 Hz.

The grid 130 may be coupled to the home through the modular inverter system 110 in this example. Further, these electrical connections may include respective circuit breakers/disconnect switches (switch 131 associated with the grid 130 and switch 136 associated with the home 135) that may be part of the modular inverter system 110 and controlled by the modular inverter system 110. Each of the switches shown in FIG. 1 may be circuit breakers and may also be part of the modular inverter system 110 in order to comply with NEC rules and code for providing circuit protection for each of the various electrical connections throughout the system of FIG. 1. As such, these switches, throughout this disclosure may be referred to as disconnect switches or circuit breakers without limitation on underlying function. The specific parameters of control are discussed further below. For now, attention is turned to alternative sources for electrical power associated with the system 100 of FIG. 1.

A first local power source (other than the grid 130) may be an electrical generator 140 coupled to the modular inverter system 110 though an associated disconnect switch 141. The electrical generator 140 may be a gasoline-fired generator, a natural gas-fired generator, a propane-fired generator or any other generator that is capable of generating electrical power at a nearly constant voltage of 120/240 VAC with a nearly constant frequency of 60 Hz. Such a local electrical generator 140 may be used at the home 135 to supply electrical power in lieu of the electrical grid 130 during grid power outages and/or during low voltage battery conditions. Since the electrical generator 140 generates electrical power with the same parameters as the grid 130, the modular inverter system 110 simply provides the capabilities of a transfer switch. Such a transfer switch is discussed further below with respect to FIG. 2, but for now, it is sufficient to understand that the transfer switch prevents the grid 130 and the generator 140 from being simultaneously coupled to the home 135 (via mutually exclusive control of switches 141 and 131).

Aside from the power sources that supply power at a nearly constant voltage of 120/240 VAC with a nearly constant frequency of 60 Hz (generator 140 and grid 130), additional local power sources may be used in conjunction with a local battery array 120. A first example of a local power source may be a solar panel array 115 configured to convert solar energy into electrical energy. This converted electrical energy may be used to provide charge to the battery array 120 and may be isolated from the battery array via disconnect switch 116. A typical solar array 115 will generate electrical power at approximately 600 VDC with individual panels generating about 10-20 VDC each. Similarly, a second example of a local power source may be a wind turbine 118 configured to convert wind energy into electrical energy. Other local power sources contemplated but not shown include fuel cells and hydro-electric generators that may include commercial applications up to 1000 VDC. This converted electrical energy may be used to provide charge to the battery array 120 and may be isolated from the battery array via disconnect switch 119. A typical wind turbine will generate electrical power up to approximately 600 VDC.

As these local power sources (solar panel 115 and wind turbine 118) typically do not generate power at that which is typically used at a home 135 (a nearly constant voltage of 120/240 VAC with a nearly constant frequency of 60 Hz), the battery array 120 may be used to store electrical charge generated from the local VDC sources. Further, any battery array 120 will only provide a direct current (DC) voltage (typically 48 VDC) and most power sinks require alternating current (AC) voltage (Typically 120/240 VAC). Thus, the modular inverter system 110 may be used to invert DC voltage from the battery array 120 into AC voltage for use at the home 135. Therefore, the battery array may be electrically isolated at times from the modular inverter system 110 via disconnect switch 121.

Each of the disconnect switches in FIGS. 1 (116, 119, 121, 131, 136, and 141) may be housed within and controlled by the modular inverter system 110 at various times according to what power source may be providing electrical power to the home 135. The modular inverter system 110 therefore performs several functions in a singular interconnected control system. These functions may include modules for providing one or more automatic transfers between power sources, one or more inverters, one or more battery chargers, one or more charge controllers, one or more electrical panels, electrical surge protection, and electrical circuit breaker protection. Further, each of these functions may be provided with dedicated modules that may be swapped in and out (during operation—referred to as "hot swapping") of a system housing having common backplanes (e.g., a 120/240 VAC backplane and a 48 VDC backplane). Therefore, the overall inverter system 110 is modular, configurable and flexible to meet the needs to almost any configuration of equipment. These modules and associated features are discussed next with respect to FIG. 2.

Figure 2:
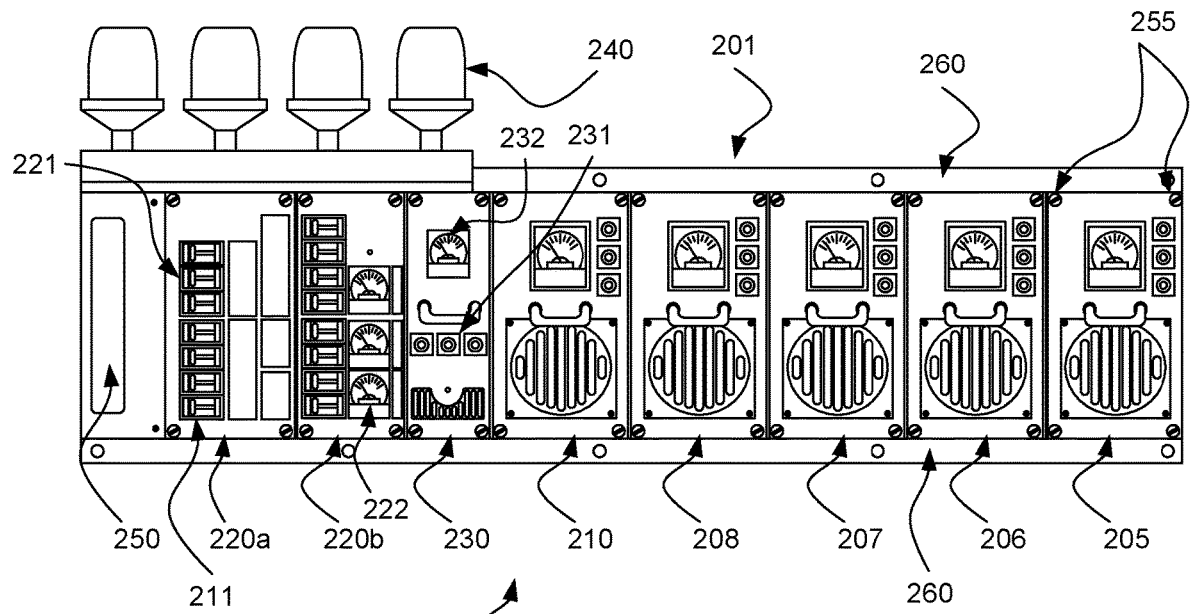
FIG. 2 is a diagram of the modular inverter system of FIG. 1 according to an embodiment of the subject matter disclosed herein.

FIG. 2 is a diagram of the modular inverter system of FIG. 1 according to an embodiment of the subject matter disclosed herein. As discussed above with respect to FIG. 1, the modular inverter system 100 includes a number of modules for facilitating various interconnection between power sources and power sinks. Such interconnections are managed in a manner that will convert power signals from any power source to a suitable power condition (e.g., electrical power at a nearly constant voltage of 120/240 VAC with a nearly constant frequency of 60 Hz) for use at the power sink—in the case of FIG. 1, a residential home 135. Several different modules are shown in FIG. 2, but a skilled artisan understands that the configuration shown in FIG. 2 is but one example. In the example of FIG. 2, the modules include an electrical panel module 210, a set of four inverter/charger modules 205-208, a charge controller module 210, a system controller module 230, and an electrical interconnection panel module 220A/B. The modular inverter system 110 may further include one or more handles 250. Each of these modules may be configured to be inserted into a rack-style housing 201, wherein at least some of these modules may be pulled out or inserted while other modules remain functional and in use. Prior to discussing the inter-related functionality of the modules within the modular inverter system 110, each of the modules is described next with respect to individual underlying functionality.

The first module to be discussed is one of the set of four inverter/charger modules 205-208; for the sake of selecting one module for the purpose of exemplary discussion, inverter/charger module 205 will be used. The inverter/charger module 205 comprises two portions: an inverter portion and a charger portion. The inverter portion, sometimes called a power inverter, is an electronic device having circuitry that changes direct current (DC) to alternating current (AC). The input voltage, output voltage and frequency, and overall power handling depend on the design of the specific device or circuitry. Thus, one function of the inverter portion is to convert a 48 VDC signal from a battery array (120 of FIG. 1) to a 120/240 VAC signal at 60 Hz for use at a power sink, such as a residential home (135 of FIG. 1). Inverters are often rated in terms of power (e.g., watts) that the circuitry can handle. In one embodiment, each modular inverter 205 can handle approximately 2 kW or power, however, other sizes are possible and each inverter in the set of five inverter/charger modules need not be matched. Further, not all five spaces need be filled with an inverter/charger module.

The second portion of the inverter/charger module 205 comprises a battery charger portion. A battery charger, or simply charger, is a device used to inject energy into a one or more cells of a rechargeable battery by coupling an electric current from a power source (e.g., the battery 120, the grid 130, the generator 140 and the like as shown in FIG. 1). The charging procedure depends on the size and type of the battery being charged. Some battery types have high tolerance for overcharging and can be recharged by connection to a constant voltage source or a constant current source. Once charged (determined via common battery charge level monitoring), the charger may be disconnected from the battery at the end of the charge cycle, or may have a timer to cut off charging current at a fixed time.

Thus, the inverter/charger module 205 may function as an inverter when the power source for supplying power to the home 135 is the battery 120 (e.g., off-grid and not on generator power). In such a mode, the modular inverter system 110 may also invoke the charger portion of each inverter/charger module 205-209 to continue providing a charge signal from an off-grid power source (e.g., the solar panel 115 or wind turbine 118). In a reciprocal manner, the inverter/charger module 205 may function as a charger when the power source for supplying power to the home 135 is the grid 130 or the generator 140 such that power is drawn from the grid 130 or generator 140 to charge the battery 120.

When one or more inverter/charger modules 205-208 are used to provide charge to the battery 120, a charge controller module 210 may be also used to monitor and facilitate a more efficient transfer of electrical energy from one of the various power sources to the battery array 120. A charge controller, (sometimes called a charge regulator or battery regulator) may be used to limit the rate at which electric current is fed to or drawn from the battery array 120. The charge controller module 210 may be further controlled by the system controller module 230 such that overcharging may be prevented to protect against overvoltage, which can reduce battery 120 performance or lifespan, and may pose a safety risk. In conjunction with the system controller module 230, the charge controller module 210 may also prevent completely draining ("deep discharging") the battery array 120, or perform controlled discharges, depending on the battery technology, to protect battery life. Upper and lower limits of battery voltage may be set by the system controller module 230 for the purposes of engaging the charge controller module 210.

If the charge controller 210 is to be used to facilitate efficient charging of the battery array 120 from power derived from an off-grid power source (e.g., the solar panel 115 or the wind turbine 118), the charge controller module 210 may be used to maximize the efficiency of power transfer. This may be accomplished with a charge controller module 210 that includes a Maximum Power Point Tracking (MPPT) feature such that the voltage generated from the off-grid power source may be tracked to determine an optimal current to be used to charge the battery array 120. MPPT is a technique used commonly with wind turbines and photovoltaic (PV) solar systems to maximize power extraction under all conditions. A particular problem addressed by MPPT is that the efficiency of power transfer from the solar cell or wind turbine depends on both the amount of sunlight falling on the solar panels or wind speed and the electrical characteristics of the load. As the amount of sunlight or wind varies, the load characteristic that gives the highest power transfer efficiency changes, so that the efficiency of the system is optimized when the load characteristic changes to keep the power transfer at highest efficiency. This load characteristic is called the maximum power point and MPPT is the process of finding this point and keeping the load characteristic there. Electrical circuits can be designed to present arbitrary loads to the photovoltaic cells and then convert the voltage, current, or frequency to suit other devices or systems, and MPPT solves the problem of choosing the best load to be presented to the cells in order to get the most usable power out.

Embodiments of the charge controller module 210 may include inputs for 200 VDC and 600 VDC. The 200 VDC embodiment is capable of handling 120-160 amps making such charge controller modules 210 among the largest in the market. The 600 VDC embodiment is capable of handling 100 amps making such charge controller modules 210 the largest in the present-day market. Further, in the modular inverter system 110 can be configured to have a mix of charge controller modules 210 including different versions (e.g., a 200 VDC version next to a 600 VDC version) such that different sets of solar panels and/or wind turbines may be accommodated.

The charge controller module 210 may also include indicator lights 231 showing the state of the charge controller (e.g., currently charging battery at a first indicator light, currently discharging the battery at a second indicator light, and battery disconnected at a third indicator light). Further, the charge controller 210 may include a current meter 232 showing current flow to or from the battery and may be set manually to monitor specific currents.

The modular inverter system 110 may also include an electrical panel 220A/B that may be coupled to various loads or power sinks via circuit breakers/disconnects. The electrical panel 220A/B provides circuit breakers 211 for each circuit load to be fed. In FIG. 1, the electrical panel 220A/B is shown as a first module ("A") and a second module ("B") though these modules need not be separate and can be one single large module ("A/B"). These circuit breakers may correspond to the disconnect switches 116, 119, 121, 131, 136, and 141 depicted in FIG. 1. The circuit breakers may typically range in size from 15 amps to 200 amps and may be configured to directly receive circuit wires through a rear-panel harness (not shown). The electrical panel 220A/B may include spaces for additional circuit breakers that have yet to be installed. The entire electrical panel module 220A/B itself is modular in that the electrical panel module 220A/B may be inserted and removed from the housing such that the module interfaces with a backplane voltage bus (not shown in FIG. 2).

The electrical panel module 220A/B may include an AC bypass switch 221 that is configured to couple one or more AC inputs directly to one or more AC output nodes and to decouple the AC bus that is part of the backplane of the modular inverter system 110. In this manner, one can bypass the modular inverter system 110 for the purposes of maintenance and troubleshooting without risk of electric shock from components coupled to the AC bus. The electrical panel module 220A/B may feature the circuit breaker/disconnect switches (e.g., 116, 119, 121, 131, 136, and 141 of FIG. 1), in reachable positions such that an operator may manually connect or disconnect any switch at any time. However, the modular inverter system 110 may provide hardware-based or software-based safety provisions that do not allow certain circuit breakers/disconnect switches to be simultaneously connected. Further, the electrical panel module 220A/B may include a number of meters 222 for monitoring current flow to and from various power sources and power sinks.

The modular inverter system 110 may also include one or more surge protection devices 240. A surge protection device (sometimes called, surge protector, surge suppressor, surge diverter, or lightning arrestor) is an appliance or device designed to protect electrical devices from voltage spikes. The surge protection device 240 attempts to limit the voltage supplied to an electric device by either blocking or shorting to ground any unwanted voltages above a safe threshold. Lastly, the modular inverter system 110 may also include a simple handle 250 for handling the overall housing.

Figure 4:
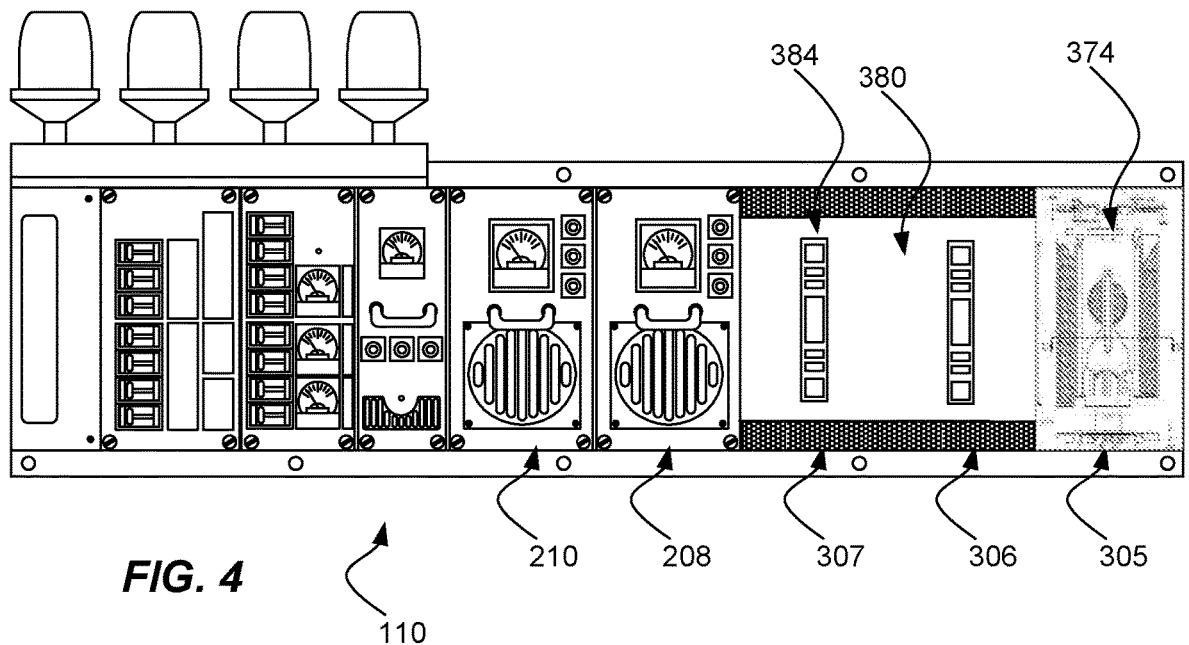
FIG. 4 is a diagram of the modular inverter system of FIG. 1 having some inverter/charger modules removed according to an embodiment of the subject matter disclosed herein.

The modular inverter system 110 when equipped with the modules as shown provides a number of advantages when used within the system 100 of FIG. 1. One advantage is that the modular inverter system 110 is, in fact, modular. This allows any of the modules to be hot swapped while any power source remains engaged and providing power to any connected load. In this embodiment, there are five "power" module spaces shown that are currently filled with inverter/charger modules 205-208. In other embodiments, there may be only three power modules (differentiated from module spaces reserved for control features, such as modules 210, 220A/B, and 230). In still further embodiments, there may more than five modules or a second housing (not shown) with additional power module spaces electrically coupled to a first housing 201. Further yet, not all power module spaces need be filled (as is shown in FIG. 4 and discussed below).

The modules may be easily swapped in and out using simple securing mechanisms such as thumbscrews 255. Such thumbscrews typically do not require any tool to operate and actuate. Further, the housing may include wing brackets 260 for mounting to a wall using conventional screws or other fastener. The weight of the modular inverter system 110 is small enough to not require triangle bracing or other form of support from below. Additional features of the modular inverter system 110 are discussed further below in the context of FIGS. 3-7.

Figure 3:
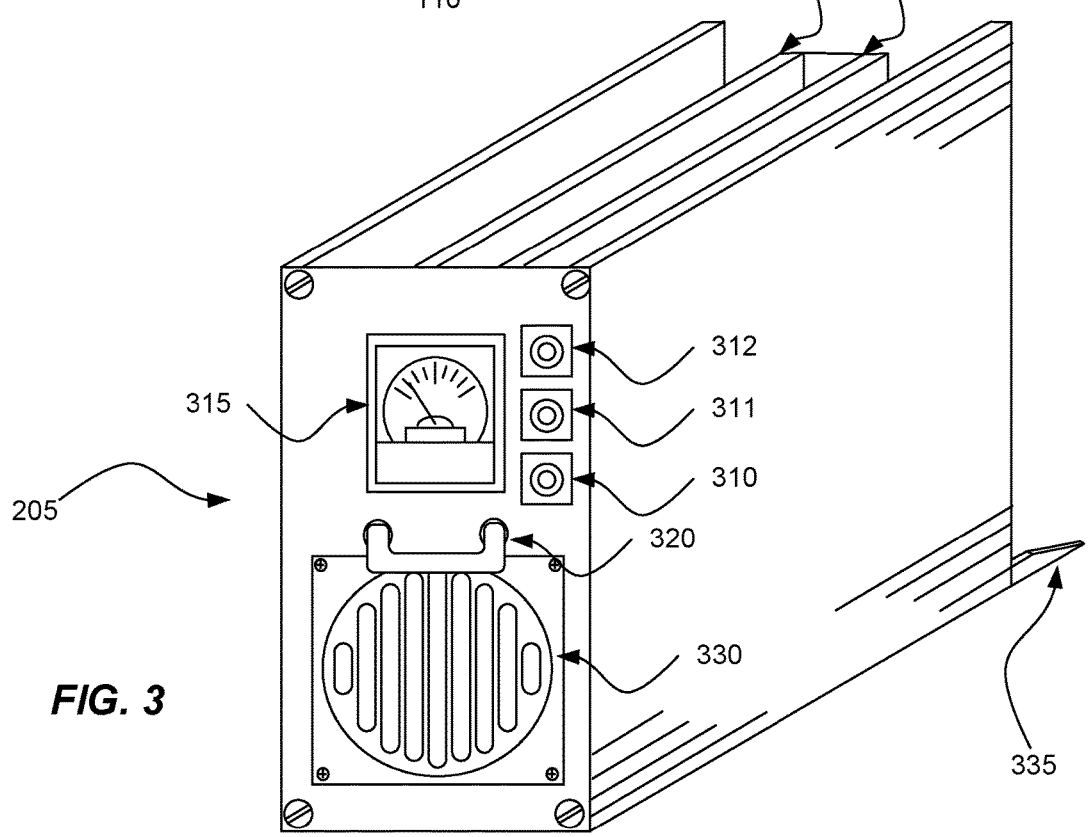
FIG. 3 is a diagram of one inverter/charger module of FIG. 2 according to an embodiment of the subject matter disclosed herein.

FIG. 3 is a diagram of one inverter/charger module 205 of FIG. 2 according to an embodiment of the subject matter disclosed herein. The inverter/charger module 205 is shown disengaged from any modular inverter system 110 so that additional features may be seen. Specifically, two different internal protrusions 350 and 351 are shown. These protrusions 350 and 351 may be printed circuit boards (PCB) having electronic components configured to couple the inverter/charger module 205 to one or more internal busses in a modular inverter system 110 via a peripheral interface that may be part of backplane. Thus, a first PCB protrusion 350 may be a circuit configured to engage a 48 VDC bus such that the inverter/charge module may draw power from the battery (120 of FIG. 1—also coupled to the 48 VDC bus) to be inverted into a voltage signal at nearly 120/240 VAC and nearly 60 Hz. The inverted 120/240 VAC signal is routed to the second PCB protrusion 351 to be coupled to a second bus that is for 120/240 VAC and coupled to the home 135 and/or grid 130. Thus, when the inverter/charger module 205 is being used as an inverter, a 48 VDC signal is drawn from the battery and inverted to a 120/240 VAC signal for use at the load.

Likewise, the second PCB protrusion 351 may be a circuit configured to engage a 120/240 VAC bus such that the inverter/charge module 205 may draw power from the grid (130 of FIG. 1—also coupled to the 120/240 VAC bus) to be converted into a voltage signal at nearly 48 VDC. The converted 48 VDC signal is routed to the first PCB protrusion 350 to be coupled to a first bus that is for 48 VDC and coupled to the battery 120. Thus, when the inverter/charger module 205 is being used as a charger, a 120/240 VAC signal is drawn from the grid 130 (or generator 140) and converted to a 48 VDC signal for charging the battery 120.

Additional PCBs (not shown) may also be present in some embodiments for facilitating electrical couplings and communications between the PCBs 350 and 351. Further, in some embodiments, the outside walls (shown in FIG. 3, but not called out by reference number) may not be present such that only the PCB protrusions 350 and 351 extend back beyond the front faceplate of the inverter/charger module 205.

In an embodiment, inverter/charger module 205 is rated to provide approximately 2000 watts of continuous power inverted from a coupled battery 120 wherein the battery 120 is coupled to a 48 VDC nominal input. When used as a charger, the inverter/charger module 205 includes circuitry to provide power factor correction depending on the current charge state of the coupled battery 120. Each inverter/charger module includes indicator lights and/or selection buttons for various states of operation. In one embodiment, these indicator lights and/or selection buttons include engaged meter selection button 310 (e.g., selection for meter to monitor AC or DC bus), AC voltage present light 311 and a DC voltage present light 312 indicative of the what a local meter may be measuring. Further, the inverter/charger module 205 includes a meter 315 for current flow (either to the battery 120 when charging or to the home 135 when inverting). In other embodiments not shown, these indicator lights and/or selection buttons include inverter module engaged 310 (e.g., power on), input voltage present 311 and a scale light 312 indicative of the what a local meter is measuring. Further yet, inverter/charger module 205 includes a fan port 330 for providing an airflow path through the inverter/charger module 205 for cooling the inverter/charger module 205.

In this embodiment, the inverter/charger module 205 is hot swappable. Thus, an operator may use a front-panel mounted handle 320 to pull the inverter/charger module from the housing (assuming the thumb screws have been disengaged). This pulling motion will disengage peripheral interface connectors on each PCB board 350 and 351 and may result in a transient current arc (e.g., current spike). Such transients may cause voltage fluctuations. However, each PCB board 350 and 351 provides a current path such that all voltage above 30 VAC or 30 VDC are dissipated within 0.5 seconds after backplane connectors disengage from any peripheral interface. That is, each PCB board 350 and 351 includes a spark arrestor circuit configured to arrest a transient current generated from the removal of the power module. Further, each inverter/charge module 205 includes on-board fuses for AC input/output and for DC input. Thus, a defective module 205 blows local fuses rather than taking down the entire modular inverter system 110 by blowing a battery breaker.

Each inverter/charger module 205 may be controlled by a system controller module 230 to be in one of two modes of operation. A first mode of operation may be an inverting mode whereby the inverter/charger module 205 functions as an inverter. In such an inverter mode of operation, current from the DC bus may be drawn by the inverter/charger module 205 (e.g., a magnitude of DC-sourced current) and inverted into an AC signal to be placed on the AC bus. Ultimately, power derived from this DC-sourced current may be used to provide AC power to the power sink (e.g., the residence 130 or any load). In an opposite manner, a second mode of operation may be a charging mode whereby the inverter/charger module 205 functions as a charger. In such a charger mode of operation, current from the AC bus may be drawn by the inverter/charger module 205 (e.g., a magnitude of AC-sourced current) and converted into an DC signal to be placed on the DC bus. Ultimately, power derived from this AC-sourced current may be used to provide DC power to the battery for the purpose of charging the battery 120.

In one embodiment, when more than one inverter/charger module 205 is installed in a modular inverter system 110, the system controller module 230 may be configured to control each inverter charger module 205-208 collectively as a bank of inverter/charger modules 205-208. Thus, each inverter/charger module 205-208 is in the same mode of operation as the others (e.g., either inverting or converting/charging). In another embodiment, however, when more than one inverter/charger module 205 is installed in a modular inverter system 110, the system controller module 230 may be configured to control each inverter charger module 205-208 individually as discrete inverter/charger modules 205-208. Thus, each inverter/charger module 205-208 may be set to be one mode or the other (e.g., either inverting or converting/charging). In this manner, one inverter/charger module 205 may be drawing power from the DC bus and converting for use as a load or for selling back to the grid 130, while a different inverter/charger module 206 may be inverting power from the AC bus for providing a charge signal to the battery 120. Additionally, the inverter/charger module includes a safety door engagement protrusion 335 that will be discussed in greater detail below with respect to FIG. 6. Such a protrusion may engage with a safety door latching mechanism in order to unlatch the safety door thereby allowing the inverter/charger module 205 to be inserted into an empty module receptacle. Next, a modular inverter system having empty module receptacles is discussed with respect to FIG. 4.

FIG. 4 is a diagram of the modular inverter system 110 of FIG. 1 having some modules removed according to an embodiment of the subject matter disclosed herein. The modular inverter system 110 shown in FIG. 4 is similar to the modular inverter system 110 of FIG. 2 except that three particular modules 205, 206, and 207 are removed to show empty spaces 305, 306, and 307. The empty spaces show inside the housing 201 such that peripheral interfaces to the backplane 380 can be illustrated. As can be seen, a typical module bay may include a peripheral interface 384 such that protruding connectors of various module may "stab" into the open peripheral interfaces. Other manners of interfacing swappable modules with a backplane 380 are contemplated but not shown for brevity.

The backplane 380 may itself be a printed circuit board having electrical traces for control signals. The backplane 380 may include a first side (the side that can be seen in the empty spaces 306 and 307) that has several peripheral interfaces 384 for engaging various modules, such as an inverter/charger module 205. The backplane 380 includes a second side that is opposite the first side with the peripheral interfaces. This second side cannot be seen in FIG. 4, but includes two backplane busses. The first backplane bus is a 48 VDC backplane bus and the second backplane bus shown is a 120/240 VAC backplane bus. Any inverter/charger module (e.g., inverter/charger module 208 in FIG. 4) and the charge controller module 210 may engage these backplane busses with respective stab-in connectors that may be part of respective PCB protrusions 350 and 351 as shown in FIG. 3. However, when such modules are removed (e.g., during a hot swap or if such modules are not needed), one can see that the peripheral interfaces to such busses are exposed. Such exposure may be dangerous to operators who may touch said backplane busses accidentally.

To prevent accidental shock hazard and to comply with electrical code and electrical standards (e.g., UL listing and the like), each empty space may include a movable safety door 374. In FIG. 4, one safety door 374 is shown at space 305. Further, space 306 and 307 are shown without safety doors so as to illustrate a backplane 380. Safety door 374 may be spring-mounted such that as a module is pulled from housing, the safety door 374 swings down into place. Further, the safety door may include a latching mechanism (not shown in detail) preventing the safety door 374 from swinging back open when any force is applied to the front of the door 374. The latching mechanism may be released when a safety door engagement protrusion 335 of any module (such as the module 205 depicted in FIG. 3). The safety door 374 may also be opened using a tool (also not shown) designed to disengage the latching mechanism. Providing a closed and latched safety door 374 improves air flow across the backplane 380 when no module is installed in a particular space. In other embodiments, air restrictors (e.g., empty modules) may be installed in module bays that are empty so cooling air is not channeled into an empty module bay. In this manner, unique airflow routes for providing cooling air above and below installed modules to get to each module bay is maintained. A more detailed view of the safety door 374 is discussed next with respect to FIG. 5.

Figure 5:
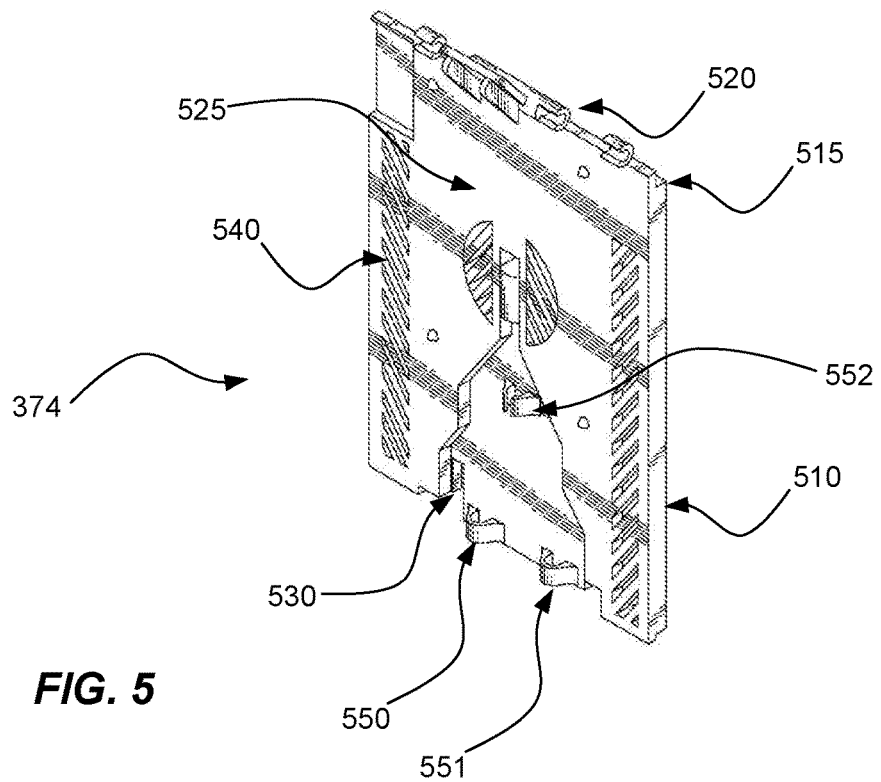
FIG. 5 is an isometric diagram of a safety door disengaged from any module receptacle or enclosure according to an embodiment of the subject matter disclosed herein.

FIG. 5 is an isometric diagram of a safety door 374 disengaged from any module receptacle or enclosure according to an embodiment of the subject matter disclosed herein. The safety door 374 may be made from a UL-listed anti-flammable plastic material such that the main portion of the safety door 374 forms a rigid door member 510 that can withstand the wear and tear of quasi-industrial use. Further, the rigid door member includes a first side 525 that includes a latching mechanism (not shown in FIG. 5). Further yet, the rigid door member 510 includes an edge that may have a hinge mechanism 520 disposed thereon. The hinge 520 allows the rigid door member to rotate about an axis that is in line with the edge 515. Although not shown in FIG. 5, this hinge 520 is typically also attached to on opening or a module receptacle of a modular inverter system enclosure (260 of FIG. 2). The safety door 374 also includes air flow holes 340 that allow heat to bleed out of the enclosure. Although air flow is best restricted from flowing through an empty receptacle (e.g., the door is rotated into a position to cover an empty receptacle), some air may still flow through the empty receptacle and the air flow holes 340 allow hot air to escape the enclosure.

The safety door includes a latching mechanism that may be raised and lowered. The latching mechanism is not shown in FIG. 5, but the latching mechanism retaining clips are shown. Thus, a top retaining clip 552 as well as two lower retaining clips, a left retaining clip 550 and a right retaining clip 551 are part of the rigid door member 510. The retaining clips 550, 551, and 552 may hold a latching mechanism in place such that the latching mechanism may freely move up and down. The rigid door member 510 also includes a disengagement orifice 530 that may receive a disengagement protrusion from a module about to be engaged with a modular inverter system. As a disengagement protrusion (not shown) enters the disengagement orifice 530, a latching mechanism (not shown) may be disengaged from the latch position. As the latching mechanism is not shown in FIG. 3, the specific interaction of the disengagement protrusion with the disengagement orifice 530 is discussed below with respect to FIGS. 6 and 7.

Figure 6:
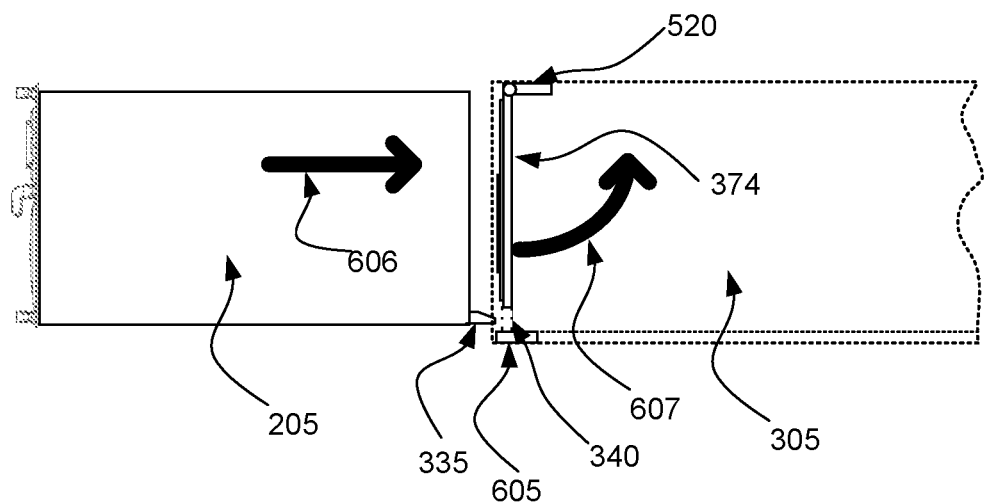
FIG. 6 is a side view of a power module about to engage a module receptacle such that a safety door that will be unlatched and opened according to an embodiment of the subject matter disclosed herein.

FIG. 6 is a side view of a power module 205 about to engage an empty module receptacle 305 such that a safety door 374 will be unlatched and opened according to an embodiment of the subject matter disclosed herein. As discussed above, the power module 205 includes a disengagement protrusion 335 that is configured to engage a disengagement orifice 340 such that a latching mechanism (not shown) may disengage the safety door 374 from a latched position. As a power module 205 is aligned and moved toward a closed and latched door 374 in a lateral direction 606, the disengagement protrusion 335 may enter the disengagement orifice 340. As the disengagement protrusion 335 contacts the latching mechanism, the sloped angle of the leading edge of the disengagement protrusion 335 pushes the latching mechanism upwards.

Prior to upward motion, the latching mechanism may be engaged with a latch receptacle 605 such that latch studs (not shown) may be inserted into stud holes (not shown individually) that may be part of the latch receptacle 605. When inserted, the latch studs prevent the safety door 374 from swinging open along the motion arc 607. However, as the disengagement protrusion pushes the latching mechanism upwards, the latch studs are lifted out of the latch receptacle 605 and the safety door may be rotated in the motion arc 607 to an open position. The swinging motion along the arc 607 is rotated about the hinge point 520. Thus, a power module 205 may be inserted into the empty module receptacle 305 as the safety door 374 is unlatched when a power module 205 having a disengagement protrusion 335 is properly aligned and inserted into the disengagement orifice 340. Additional details about the latching mechanism are discussed next with respect to FIG. 7.

Figure 7:
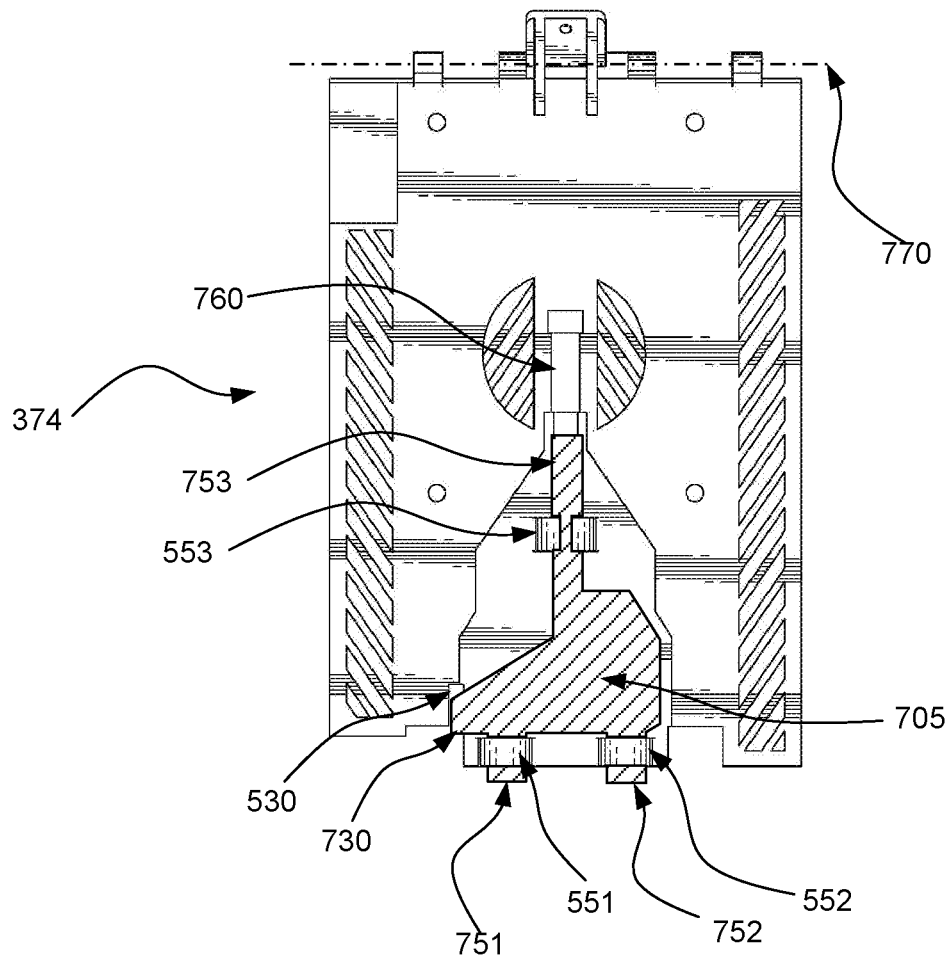
FIG. 7 is a front view of a safety door showing a latching mechanism according to an embodiment of the subject matter disclosed herein.

FIG. 7 is a front view of a safety door 374 showing a latching mechanism according to an embodiment of the subject matter disclosed herein. As can be seen in FIG. 7, the latching mechanism may include a rigid latch member 705 that is secured (although still movable) to the three retaining clips 551, 552, and 553 as discussed above. The retaining clips 551, 552, and 553, hold the latching member 705 in a way such that the latching member 705 may be freely moved up and down along a vertical axis. In order to allow for movement along this vertical axis, protrusions on the latching member 705 are respectively retained by the retainer clips. Thus, an upper latching member protrusion 753 is retained by upper retainer clip 553, a lower left latching member protrusion 751 is retained by lower left retainer clip 551, and a lower right latching member protrusion 752 is retained by lower right retainer clip 552.

Further, the latching member includes a disengagement protrusion 730 that extends to and covers the disengagement orifice 530. As a disengagement protrusion of an inserting power module (not shown) enters the disengagement orifice, the sloped edge of the entering protrusion contacts the latching member disengagement protrusion and forces the latching member upwards. This causes the lower left latching member protrusion 751 and the lower right latching member protrusion 752 to move upwards as well and thereby removed from being engaged with any latch receptacle (shown as 605 in FIG. 6). Being disengaged from any latch receptacle, the entire safety door 374 may freely rotate about an axis 770 in line with the safety door hinge.

The safety door hinge may also be biased to force the safety door back to a closed position when a power module is not engaged with a module receptacle. Further, the latching mechanism may further include a biasing member 760 (e.g., a spring or the like) that biases the latching member 705 to the down position. The bias of the hinge and the bias of the latching member 705 work in concert to force the safety door to a closed and latched position when a module receptacle is empty.

All references, including publications, patent applications, and patents, cited herein are hereby incorporated by reference to the same extent as if each reference were individually and specifically indicated to be incorporated by reference and/or were set forth in its entirety herein.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted. Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments and does not pose a limitation to the scope of the disclosure unless otherwise claimed. No language in the specification should be construed as indicating any non-claimed element as essential to each embodiment of the present disclosure.

Different arrangements of the components depicted in the drawings or described above, as well as components and steps not shown or described are possible. Similarly, some features and sub-combinations are useful and may be employed without reference to other features and sub-combinations. Embodiments have been described for illustrative and not restrictive purposes, and alternative embodiments will become apparent to readers of this patent. Accordingly, the present subject matter is not limited to the embodiments described above or depicted in the drawings, and various embodiments and modifications can be made without departing from the scope of the claims below.

That which is claimed is:

1. A modular electrical-device receptacle, comprising:
   a cavity configured to receive a modular power device, such that the modular power device is aligned to engage a backplane;
   an electrical device interface disposed in the cavity and configured to interconnect, via the backplane, a battery, an electrical connection to an electrical grid, a local power generator and a power sink;
   a rigid door member having a side and an edge, the rigid door member sized to cover an opening to the cavity to prevent exposure of the backplane;
   a hinge disposed on the edge of the rigid door member, the hinge configured to allow a swinging motion of the rigid door member;
   a latch mechanism disposed on the side of the rigid door member having a disengagement orifice and configured to hold the rigid door member in a closed position; and
   a disengagement mechanism disposed on the side of the rigid door member and configured to release the latch mechanism when a modular electric device penetrates the disengagement orifice, the modular electric device sized to prevent exposure of the backplane when engaging the disengagement orifice.

2. The modular electrical-device receptacle of claim 1, wherein the modular receptacle is disposed in an enclosure having a plurality of modular receptacles.

3. The modular electrical-device receptacle of claim 1, wherein the hinge is further configured to bias the rigid door member in a closed position such that the cavity is enclosed.

4. The modular electrical-device receptacle of claim 1, wherein the latch mechanism is biased to hold the rigid door member in the closed position.

5. The modular electrical-device receptacle of claim 1, wherein the side of the rigid door member comprises a rectangular shape.

6. The modular electrical-device receptacle of claim 1, wherein the rigid door member impedes air flow through the cavity when latched in the closed position.

7. The modular electrical-device receptacle of claim 1, wherein the hinge is prevented from actuating when the latch mechanism is engaged.

8. The modular electrical-device receptacle of claim 1, wherein the rigid door member comprises a non-conductive, UL-listed, anti-flammable, plastic material.

9. An electrical system, comprising:
   a battery configured to provide DC power;
   an electrical connection to an electrical grid configured to provide AC power;
   a local power generation device configured to provide DC power;
   a power sink configured to receive AC power; and
   a modular inverter device configured to interconnect the battery, the electrical connection to the electrical grid, the local power generator and the power sink, the modular inverter device including,
      a plurality of module receptacles, each module receptacle including:
         a cavity configured to receive modular power device, such that the modular power device is aligned to engage a backplane;
         a rigid door member having a side and an edge, the rigid door member sized to cover an opening to the cavity to prevent exposure of the backplane;
         a hinge disposed on the edge of the rigid door member, the hinge configured to allow a swinging motion of the rigid door member;
         a latch mechanism disposed on the side of the rigid door member having a disengagement orifice and configured to hold the rigid door member in a closed position; and
         a disengagement mechanism disposed on the side of the rigid door member and configured to release the latch mechanism when a modular electric device penetrates the disengagement orifice, the modular electric device sized to prevent exposure of the backplane when engaging the disengagement orifice.

10. The electrical system of claim 9, wherein the power sink comprises a residence.

11. The electrical system of claim 9, wherein the battery comprises a DC current source having an approximate constant voltage of 48 VDC.

12. The electrical system of claim 9, wherein the electrical grid comprises a AC current source having an approximate constant voltage of 120/240 VAC and an approximate frequency of 60 Hz.

13. The electrical system of claim 9, wherein the local power generation device comprises one or more of the group comprised of: a solar panel array, a wind turbine, a hydro-electric generator, a fuel cell, and a photovoltaic array.

14. The electrical system of claim 9, wherein the modular electric device comprises one of the group comprised of: an inverter/charger module, a system controller module, a charge controller module, and an electrical panel module.

15. The electrical system of claim 9, wherein the modular electric device comprises a disengagement protrusion configured to penetrate the disengagement orifice when the modular electric device is aligned with the module receptacle.

16. A method, comprising:
   aligning a disengagement protrusion disposed on a leading edge of a modular electric device with an empty module device receptacle configured to receive the modular electric device, wherein the empty module receptacle includes a latched module door having a disengagement orifice that is latched in a closed position and prevented from rotating;

penetrating a disengagement orifice of the door with the disengagement protrusion;

in response to the penetration of the disengagement orifice by the disengagement protrusion disposed on the leading edge of the modular electric device, releasing the door latch such that the door is free to rotate;

rotating the module door to an open position by pushing the modular electric device into the empty module receptacle;

engaging a backplane disposed in the receptacle with the modular electric device; and arresting a transient current with a transient current arresting circuit when the modular electric device engages the backplane.

17. The method of claim 16, further comprising engaging the modular electric device with the backplane wherein the backplane is disposed in the empty module receptacle away from the module door.

18. The method of claim 17, further comprising:
pulling the modular electric device;
disengaging the modular electric device from the backplane;
rotating the module door to a closed position in response to removing the modular electric device from the module receptacle; and
engaging the latch when the door returns to the closed position.

19. The method of claim 18, further comprising preventing air flow through the empty module receptacle when the module door is in the closed position.

* * * * *